US007839655B2

(12) United States Patent
Clark

(10) Patent No.: US 7,839,655 B2
(45) Date of Patent: Nov. 23, 2010

(54) PEG AND HOLE PRESS FIT PLASTIC HOUSING

(75) Inventor: Jeffrey Allen Clark, Macomb Township, MI (US)

(73) Assignee: Continental Automotive Systems US, Inc., Auburn Hills, MI (US)

( * ) Notice: Subject to any disclaimer, the term of this patent is extended or adjusted under 35 U.S.C. 154(b) by 576 days.

(21) Appl. No.: 11/749,301

(22) Filed: May 16, 2007

(65) Prior Publication Data

US 2007/0270013 A1 Nov. 22, 2007

Related U.S. Application Data

(60) Provisional application No. 60/802,568, filed on May 22, 2006.

(51) Int. Cl.
*H05K 7/14* (2006.01)
*H05K 7/18* (2006.01)

(52) U.S. Cl. ....................................... 361/800; 361/752

(58) Field of Classification Search ................. 361/752, 361/790, 797, 800–802; 312/223; 174/138 D
See application file for complete search history.

(56) References Cited

U.S. PATENT DOCUMENTS 4,798,946 A * 1/1989 Fujii et al. .................. 235/492
5,045,971 A * 9/1991 Ono et al. .................. 361/704
5,351,051 A 9/1994 Yano et al.
5,574,628 A * 11/1996 Persia et al. ................ 361/737
5,668,654 A * 9/1997 Benjamin et al. ........... 398/139
5,719,746 A * 2/1998 Ohbuchi et al. ............. 361/737
6,388,883 B1 * 5/2002 Serizawa et al. ............ 361/752
6,798,668 B2 * 9/2004 Kozaki ....................... 361/800
6,852,929 B2 * 2/2005 Scudder ....................... 174/66
6,963,494 B2 * 11/2005 Mickievicz et al. ......... 361/795
7,008,240 B1 * 3/2006 Wang et al. ................ 439/76.1
7,218,530 B2 * 5/2007 Mickievicz et al. ......... 361/795
7,433,196 B1 * 10/2008 Wang et al. ................. 361/752
2005/0103070 A1 5/2005 Meyerson et al.

FOREIGN PATENT DOCUMENTS

| | | |
|---|---|---|
| DE | 9217973 | 5/1993 |
| DE | 19943498 | 4/2001 |
| DE | 202005014788 | 11/2005 |
| DE | 102005001002 | 7/2006 |

OTHER PUBLICATIONS

International Search Report and Written Opinion dated Jan. 24, 2008.

* cited by examiner

*Primary Examiner*—Hung S Bui

(57) ABSTRACT

A key fob includes an upper housing and a lower housing that are attachable by way of a snap fit. A pin on the upper housing interfaces with the lower housing and can be selectively filled with an accessible material to bond and substantially permanently affix the upper housing to the lower housing such that any attempts at disassembly results in evident destruction of the either the upper housing or the lower housing.

12 Claims, 2 Drawing Sheets

PEG AND HOLE PRESS FIT PLASTIC HOUSING

CROSS REFERENCE TO RELATED APPLICATION

The application claims priority to U.S. Provisional Application No. 60/802,568 which was filed on May 22, 2006.

BACKGROUND OF THE INVENTION

This invention generally relates to a plastic housing for a remote entry device. More particularly, this invention relates to a plastic housing including features to evidence tempering of internal components.

Most current vehicles include a key fob that is utilized to remotely lock and unlock a vehicle. A typical key fob includes a transmitter, circuit and a battery that are all supported within a plastic housing. In most instances it is desirable to allow disassembly of the housing to facilitate changing of the battery. Although some key fobs include a separate battery access cover, others simply provide for the housing to be split apart. As appreciated, disassembly of the housing not only provides access the battery but also access to other internal components such as the printed circuit board assembly. However, some localities have enacted regulations that require prevention of access to internal components of such transmitting devices. Accordingly, transmission devices such as key fobs are now required to include features that evidence unauthorized access to internal components.

SUMMARY OF THE INVENTION

A key fob housing provides for selective assembly to provide an accessible housing and a tamper evidencing housing that evidences unauthorized attempts at tampering with internal components.

The example key fob includes a first housing portion and a second housing portion that are attachable together to define a cavity within which a printed circuit board assembly is mounted. One of the first housing and the second housing includes openings for series of buttons that are utilized to actuate the key fob. The printed circuit board assembly disposed within the housing includes the various circuitry required to receive and transmit instructions required for operating a remote keyless entry system.

The example housing parts are of a common design and provide for two different configurations. A first configuration provides evidence of tampering by preventing the disassembly of the housing portions without damage. In this configuration, a bonding material is placed within a receptacle. The receptacle is disposed on one of the housing portions and a pin extends from the inner surface of another one of the housing portions and is received within the receptacle. The bonding material within the receptacle bonds the pin to the receptacle thereby preventing disassembly of the housing without causing damage to one or both of the housing parts.

The accessible housing configuration does not utilize the bonding material and facilitates disassembly without harming the housing portions. In the accessible configuration, no bonding material is placed in the receptacle. However the pin is received within the receptacle but because no bonding material is present no adhesion between the two parts is formed.

Accordingly, the housing configuration disclosed herein provides for both a tamper evident and an accessible key fob with common components to simplify assembly under reduced manufacturing cost.

These and other features of the present invention can be best understood from the following specification and drawings, the following of which is a brief description.

DETAILED DESCRIPTION OF THE PREFERRED EMBODIMENT

Figure 1:
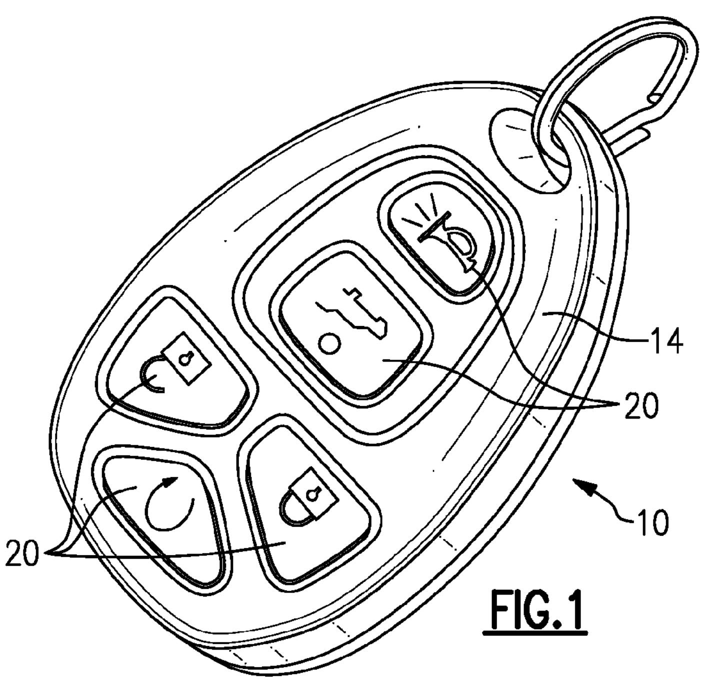
FIG. 1 is a perspective view of an example key fob.
Figure 2:
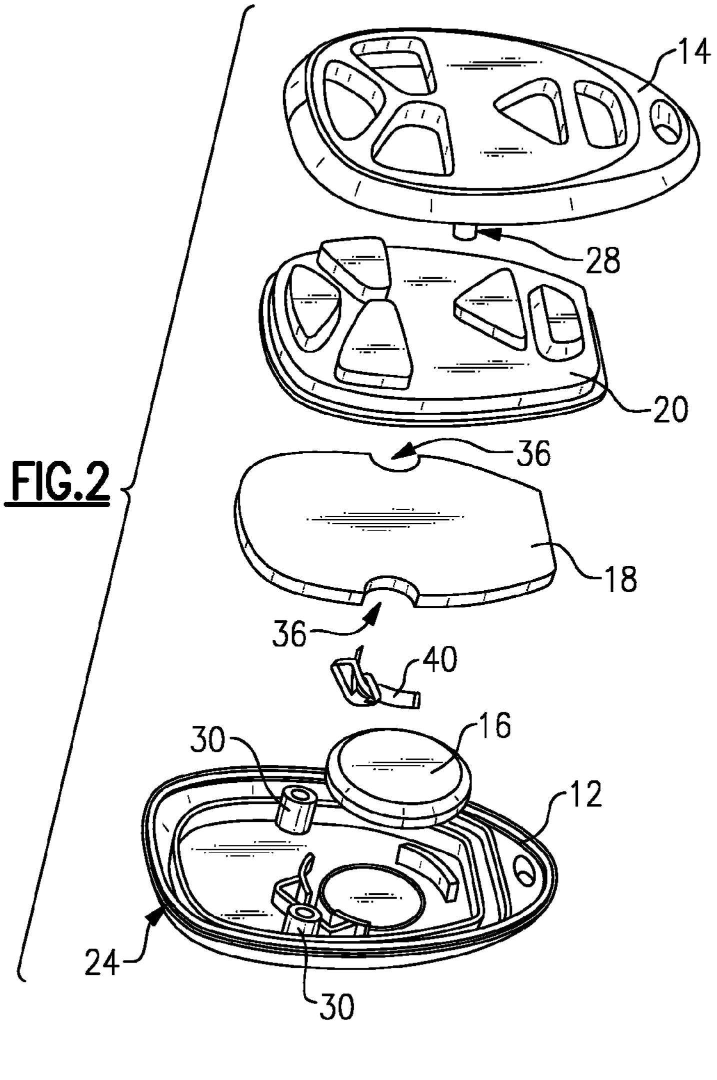
FIG. 2 is an exploded view of an example key fob.

Referring to FIGS. 1 and 2, a key fob assembly 10 includes an upper housing 14 and a lower housing 12. The upper housing 14 and lower housing 12 snap fit together to enclose a printed circuit board assembly 18. A plurality of buttons 20 extend through openings 34. The example key fob includes features that allow for the assembly of a tamper evident configuration and an accessible configuration. In the tamper evident configuration, one of the bottom housing 12 and the upper housing 14 are damaged evidencing attempts to access internal components of the key fob assembly 10. In the accessible configuration the housing parts 12, 14 may be disassembled without damage.

Referring to FIG. 2, an exploded view of the example key fob assembly 10 illustrates the lower housing 12, the upper housing 14 and the components that are received therein. The upper housing 14 and the lower housing 12 define a cavity that encloses the printed circuit board assembly 18 along with a battery 16. The battery 16 is mated with a clip 40 that is utilized to communicate electric energy to the printed circuit board 18. On top of the printed circuit board 18 is disposed a button assembly 20. The button assembly 20 corresponds and cooperates with features on the printed circuit board assembly 18 to provide for manual actuation of desired features and operation of the key fob assembly 10.

The printed circuit board 18 includes indentations 36 that provide a clearance for pins 28. The pins 28 extend from the inner surface of the upper housing 14. The pins 28 are disposed inwardly of the upper housing 14 so that they do not interfere with the snap fit features that connect and attach the upper housing 14 to the lower housing 12.

The lower housing 12 includes a groove 24 into which a tab feature on the upper housing 14 engages to provide the snap fit attachment between the upper housing 14 and the lower housing 12. The lower housing 12 also includes a pair of receptacles 30 that extend outwardly from an inner surface of the lower housing 12. The receptacles include an opening 32 into which the pin 28 is received. The pin 28 does not provide an alignment feature but instead cooperates with the receptacle 30 to allow for the selective assembly of the key fob 10 into either a tamper evident configuration or an accessible configuration.

Figure 3:
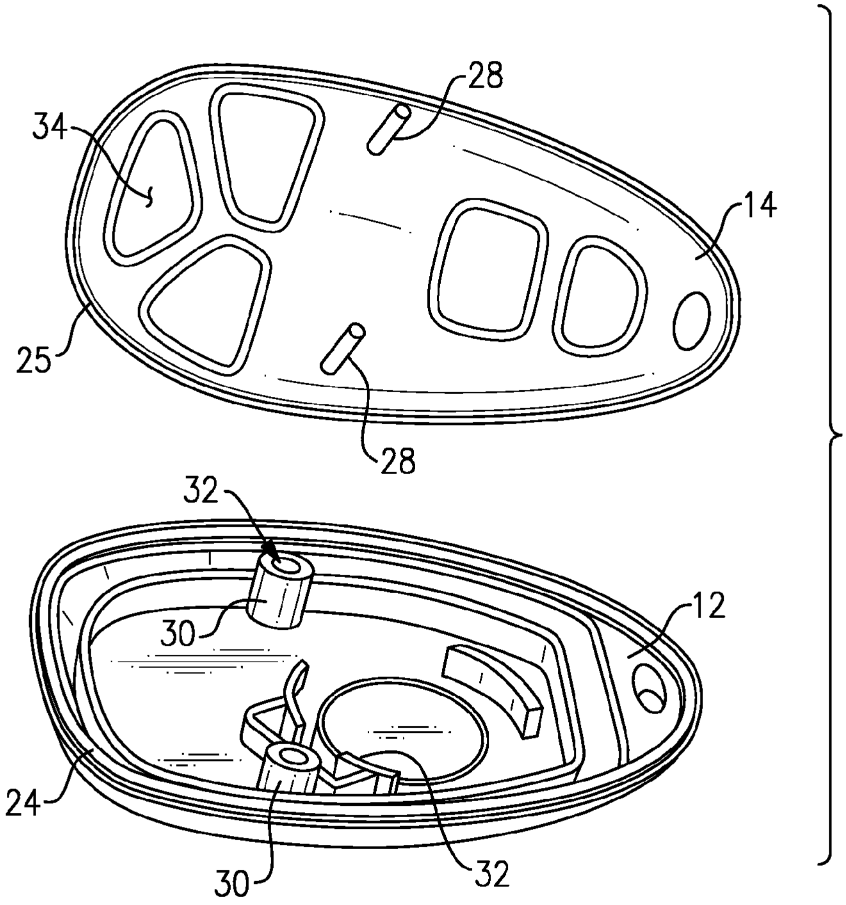
FIG. 3 is a perspective view of an upper housing portion and a lower housing portion.

Referring to FIG. 3, the lower housing 12 and the upper housing 14 are illustrated with other internal components removed for clarity purposes. The upper housing 14 includes the pins 28 that extend from the inner surface 28 towards the inner surface or cavity of the key fob 10 when it is in an assembled condition. The lower housing 12 includes the receptacle 30 that includes an opening 32 into which the pins 28 are received. The lower housing 12 includes the groove 24 disposed about the entire outer perimeter that mates with a tab portion 25 on the upper housing 14. This mating configuration between the upper housing 14 and the lower housing 12 provides a snap fit attachment of the upper housing 14 to the lower housing 12. The pins 28 fit within the openings 32 of the receptacles 30 in a clearance manner and do not touch or otherwise interfere with the inner walls of the receptacles 30.

Figure 4:
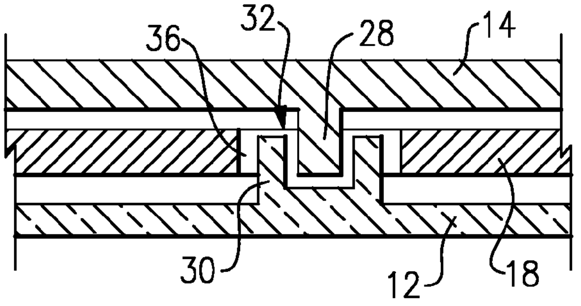
FIG. 4 is a cross-sectional view of the interface between a pin and a receptacle.

Referring now to FIG. 4, with continuing reference to FIG. 3, a cross-section is shown of the interface between the pin 28 and the receptacle 30. The pin 28 extends into an opening 32 of the receptacle 30 but does not come into contact with walls of the receptacle 30. As appreciated, the pin 28 does not provide a guide function and is received in a clearance fit within the receptacle 30. Indentations 36 of the printed circuit board assembly 18 provide and allow the pins 28 to extend adjacent to the circuit board assembly 18 and into the receptacle 30.

FIG. 4 illustrates the housing configuration and more specifically the receptacle 30 and the pin 28 configuration utilized for assembling the tamper evident housing configuration and the accessible housing configuration. In the accessible configuration the housing portions 12,14 can be split apart by undoing the snap features that hold the two portions 12,14 together. No adhesion or other material is utilized and provides for access to the internal components of the key fob 10. Access to the internal components of the key fob assembly 10 provides and facilitates operator access for changing a battery when required.

Figure 5:
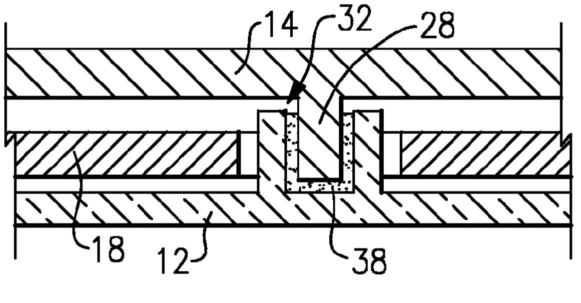
FIG. 5 is a cross-sectional view of the pin and receptacle including bonding material.

Referring to FIG. 5, also with continuing reference to FIG. 3, a cross-section of the interface between the receptacle 30 and pin 28 is illustrated for the tamper evident portion of the key fob 10. As appreciated, the same pin 28 and receptacle 30 as are utilized in the accessible version of the key fob are illustrated. However, a bonding material 38 is first filled in the receptacle 30 such that the pin 28 becomes bonded by way of this bonding material 38 to the receptacle 30. In this way any attempt at removing the upper housing 14 from the lower housing 12 will necessarily result in damage to one of the upper housing 14 and the lower housing 12. The bonding agent is provided only in instances where it is desired to provide evidence of tampering by an unauthorized person with the components of the key fob.

Referring to FIG. 2, the disclosed key fob assembly 10 is assembled according to the initial step of selectively determining whether the housing is to provide a tamper evident feature or provide for access to the internal portions of the key fob. The method of assembly includes the step of supporting a printed circuit board 18 within the lower housing 12 in a manner such that the pins 28 are free of the circuit board 18 and extend there through such that they can be received within the receptacle 30 in the lower housing 12.

The tamper evident configuration provides for the attachment of the upper housing 12 to the lower housing 14 in such a way that no disassembly can be facilitated without destroying one of the housing portions. When the tamper evident configuration is preferred the receptacle 30 is filled with an adhesive bonding material. The adhesive bonding material is preferably any type of glue or epoxy that is compatible with the material that comprises the upper housing 14 and the lower housing 12 the adhesive can be of any type that will provide a substantially permanent bond between the material of the pin 28 and the receptacle 30. The method continues with the snap fit alignment of the pin 28 into the opening 32 of the receptacle 30 and then the snap fit of the top housing 14 to the lower housing 14. Assembly of the accessible is substantially identical to that of the tamper resistant version and therefore did not require additional parts.

Accessible and tamper evident version of the disclosed key fob differs with the inclusion of the adhesive bonding material 38 within the receptacle. This provides for the use of identical parts for different versions of the same key fob. The use of identical parts for the various different versions provides economies of scale and reduces overall assembly and manufacturing cost.

Although a preferred embodiment of this invention has been disclosed, a worker of ordinary skill in this art would recognize that certain modifications would come within the scope of this invention. For that reason, the following claims should be studied to determine the true scope and content of this invention.

What is claimed is:

1. A remote entry device comprising:

a printed circuit board assembly;

a transmitter;

a first housing portion including a pin extending from an inwardly facing surface of said first housing; and a second housing portion attachable to the first housing portion for enclosing the printed circuit board assembly and transmitter, wherein said second housing portion includes a receptacle extending from an inwardly facing surface of said second housing for receiving a portion of said pin, wherein said receptacle defines a clearance fit with the pin and is selectively fillable with a bonding material for bonding said pin within said receptacle.

2. The remote entry device as recited in claim 1, wherein said first housing is attached to the second housing by a snap fit disposed about a perimeter of said first housing and said second housing.

3. The remote entry device as recited in claim 2, wherein said pin and said receptacle are spaced apart from said snap fit.

4. The remote entry device as recited in claim 1, wherein said bonding material comprises an adhesive that bonds with both said pin and said receptacle.

5. The remote entry device as recited in claim 4, wherein said first housing portion and said second housing portion is not removable from each other without damage once said pin is bonded to said receptacle.

6. The remote entry device as recited in claim 1, including at least two of said pins and at least two corresponding receptacles aligned to receive a corresponding one of said at least two pins.

7. The remote entry device as recited in claim 1, wherein said remote entry device comprises a key fob that is manually actuated for initiating a desired operation of a corresponding vehicle.

8. A method of assembling a key fob for a vehicle entry system comprising the steps of:

a) supporting a printed circuit board assembly within a first housing portion, wherein said first housing includes a pin;

b) selecting between a tamper evident configuration of the key fob and an accessible configuration;

c) filling a receptacle disposed within a second housing portion with bonding material responsive to selecting the tamper evident configuration of the key fob; and d) attaching the second housing portion to the first housing portion including receiving the pin within the receptacle.

9. The method as recited in claim 8, wherein said tamper evident configuration of the key fob comprises attaching the second housing portion to the first housing portion such that disassembly is evidenced by damage to one or both of the first and second housing portions.

10. The method as recited in claim 8, including the step of bonding the pin to the receptacle with the bonding agent to evidence disassembly of the first housing portion from the second housing portion responsive to selecting the tamper evident configuration of the key fob.

11. The method as recited in claim 8, wherein said step d) comprises attaching the second housing portion to the first housing portion with a snap-fit.

12. The method as recited in claim 8, wherein the accessible configuration comprises no bonding material and provides for separation of the first and second housings without damage.

* * * * *